(12) United States Patent
Demirdag et al.

(10) Patent No.: US 7,173,558 B2
(45) Date of Patent: Feb. 6, 2007

(54) CHARGE COMPARATOR WITH LOW INPUT OFFSET

(75) Inventors: Cuneyt Demirdag, Medford, MA (US); Michael P. Anthony, Andover, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

(21) Appl. No.: 11/175,994

(22) Filed: Jul. 6, 2005

(65) Prior Publication Data

US 2006/0017603 A1    Jan. 26, 2006

Related U.S. Application Data

(60) Provisional application No. 60/585,611, filed on Jul. 6, 2004.

(51) Int. Cl.
*H03M 1/12* (2006.01)

(52) U.S. Cl. ...................... 341/172; 341/161

(58) Field of Classification Search ............... 341/172, 341/161
See application file for complete search history.

(56) References Cited

U.S. PATENT DOCUMENTS

| | | | | |
|---|---|---|---|---|
| 4,121,248 A | * | 10/1978 | Coale, Jr. ................ 348/166 |
| 5,008,698 A | * | 4/1991 | Muramatsu et al. ........ 396/234 |
| 5,661,397 A | * | 8/1997 | Deller et al. ........... 324/207.18 |
| 5,754,056 A | * | 5/1998 | Sauer .................... 324/679 |
| 5,929,800 A | * | 7/1999 | Zhou et al. ................ 341/161 |
| 6,355,926 B1 | * | 3/2002 | Hubble et al. .......... 250/214 R |
| 6,788,563 B2 | * | 9/2004 | Thompson et al. ........ 365/145 |

* cited by examiner

*Primary Examiner*—Jean Bruner Jeanglaude
(74) *Attorney, Agent, or Firm*—Hamilton, Brook, Smith & Reynolds, P.C.

(57) ABSTRACT

A Direct Current (DC) charge comparator that provides low input offset by feeding complimentary plus and minus charge inputs to a single amplification path via an alternate input path switch. Multiple sample and hold circuits at the output of the amplification path permit comparison of the result when each of the charge inputs travels down each of the paths, to determine a correction.

12 Claims, 4 Drawing Sheets

CHARGE COMPARATOR WITH LOW INPUT OFFSET

RELATED APPLICATION

This application claims the benefit of U.S. Provisional Application No. 60/585,611, filed on Jul. 6, 2004, the entire content of which is incorporated herein by reference.

BACKGROUND OF THE INVENTION

The present invention relates to charge comparators, especially those which may be used with Charge Coupled Device (CCD) pipeline-based structures.

Circuits for performing signal processing functions are now common in numerous consumer devices such as digital cameras, cellular telephones, wireless data network equipment, audio devices such as MP3 players, video equipment such as Digital Video Disc (DVD) players, High Definition Digital Television (HDTV) equipment and numerous other products. It is well known that Charge Coupled Devices (CCDs) circuits may be used to implement many of the signal processing functions required in such products.

One circuit, called a Charge to Digital (QDC) converter, is used to convert an input analog voltage to digital data. One way to implement a QDC is as a successive approximation type converter that includes a number of charge storage stages arranged as a serial pipeline register. The input signal voltage is typically represented as a pair of complimentary charges which are processed in positive (plus) and negative (minus) signal paths. In this type of converter, the complimentary input charges pass from stage to stage down respective pipelines dedicated to processing the plus and minus signals.

One critical component of a QDC is the reference charge comparator used at each stage. The reference charge comparator compares an input charge amount to a reference charge amount, and then optionally adds a reference charge amount to each charge as it travels through the stage.

Accurate comparison of the charge input to each stage is therefore an extremely important part of assuring overall QDC accuracy. Unfortunately, Direct Current (DC) and/or Analog Current (AC) offset input errors can be introduced into these charge comparator circuits quite easily.

In a differential QDC, if a different input offset is introduced in the plus path than in the minus path, this can also result in erroneous results. Even a slight offset in the amount of a reference charge comparison result can thus have a ripple effect as the charges pass down multiple pipeline stages.

SUMMARY OF THE INVENTION

The invention is a Direct Current (DC) charge comparator that provides low input offset. Low offset is achieved through a single final amplification path using an alternate path switch and a track and hold input circuits.

More particularly, the two complimentary charge inputs are each first fed to a cross point switch. In a first state, the switch sends the input plus signal charge down a first path to first output and the minus signal charge down a second path to a second output. This is called the "non-inverted" condition. After a time, the state of the switch is swapped, so that the plus charge travels down a path to the second output, and so that the minus charge down a path to the first output. This is called the "inverted" condition of the switch.

The charges appearing at each switch output are then integrated, and the integrated outputs are then sampled and stored, such as by storage capacitors. The storage capacitors can be precharged to a preset voltage before the switch state is swapped and the output sampled and stored again. These outputs are preferably tracked by a sample and hold circuit, to avoid spikes close to the comparator decision times.

The output of the sample and hold circuit is then typically amplified before further processing.

The circuit thus provides a pair of outputs, in each of two different states. One pair of output represents the amplified and sampled plus and minus inputs in the non-inverted switch state, and another pair of outputs represents the amplified and sampled plus and minus inputs in the inverted switch state.

These outputs are then compared, preferably by using a differential difference amplifier, so that the response to a plus input in the non-inverted condition (that is, due to the plus charge traveling along one path) is compared to the response to a plus input in the inverted condition (that is, due to the plus charge traveling along the other path). The minus charges are similarly compared.

Since the input offset is amplified in the same way for both the inverted and non-inverted switch conditions, the input offset is effectively cancelled by the difference amplifier. As a result, any input charge differences are more accurately determined.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT

A description of preferred embodiments of the invention follows.

Figure 1:
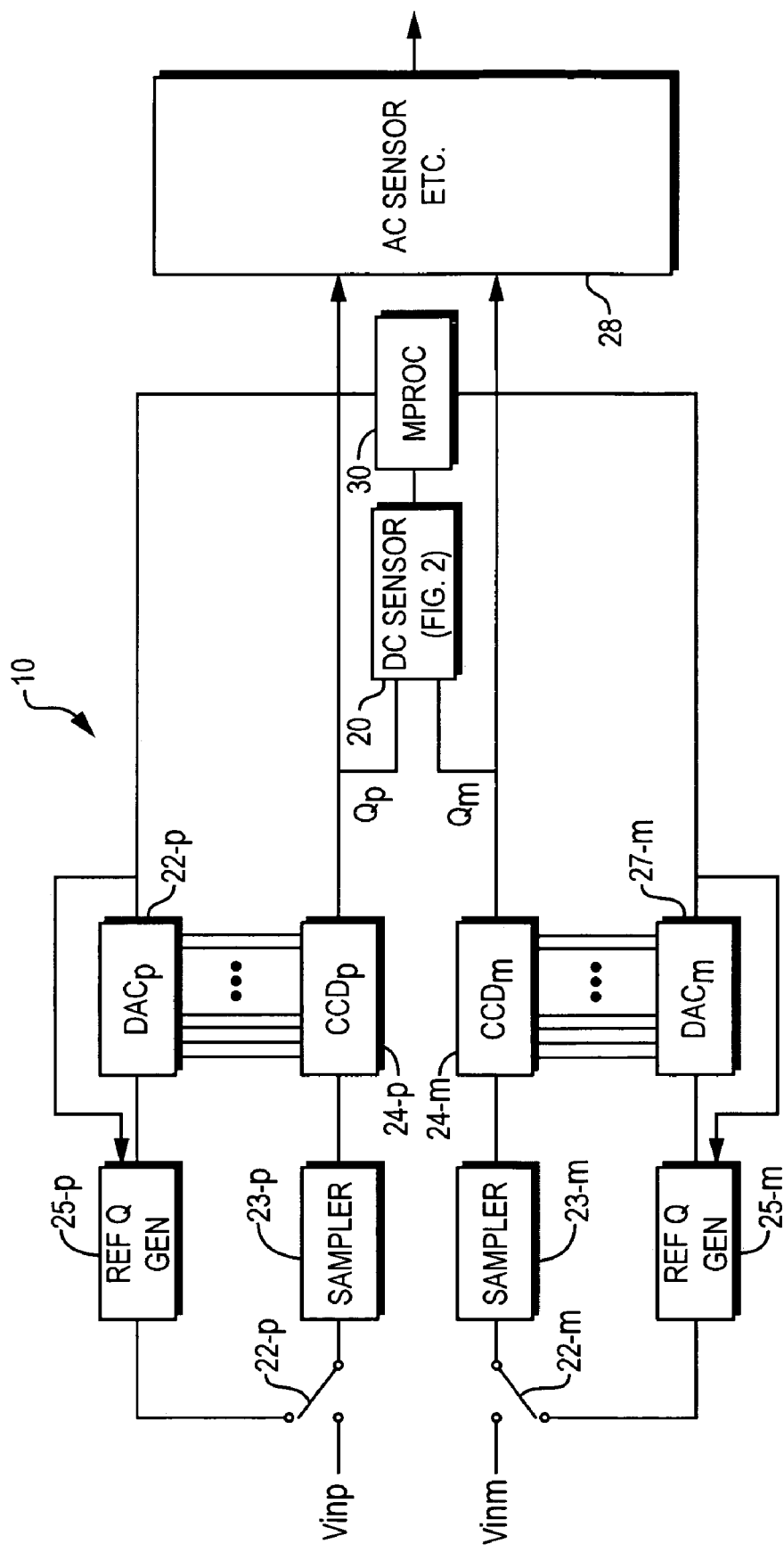
FIG. 1 is a high level diagram of a Charge to Digital (QDC) converter that may use a DC sensor according the present invention.

FIG. 1 is a block diagram of device 10 that may use a Direct Current (DC) sensor 20 according to the present invention. The illustrated device 10 is a Charge to Digital converter (QDC), but it should be understood that the DC sensor 20 may be used in other types of circuits adopted for processing charge packets.

QDC 10 is a so-called successive approximation type converter that uses a number of charge storage stages arranged as a serial pipeline register. In this type of converter, generally speaking, an input source charge passes from stage to stage along the pipeline. A reference charge generator and a charge splitter connected to each stage generate a reference charge signal for that stage. The reference charge signal is then optionally added to the charge as it travels down the pipeline, depending upon the comparison result. In the illustrated circuit there are actually two pipelines. That is, charges are carried in the circuit as complimentary pairs, which correspond to a complimentary representation of the input signals. In general, the overall operation of QDC 10 is similar to the QDC described in U.S. Pat. No. 5,579,007 issued to Paul.

It is desirable to be able to compare the charges at the outputs of the two pipelines. The present invention relates to an improvement in the accuracy of a charge comparison operation carried out within QDC 10. Referring to FIG. 1 more particularly, an input voltage is presented as a complimentary pair of voltages, VinP and VinM, representing a positive (plus) and a negative (minus) version of the input signal to be converted. Switches 22-P and 22-M, one for each of the plus and minus paths, provide the selected input signal to a corresponding sampler 23-P and 23-M.

The samplers 23 each convert their respective input voltage to a charge. The charges output by the samplers 23 are then fed to an input stage of a respective charge pipeline 24-P, 24-M. The charge pipelines 24 may each use a Charge Coupled Device (CCD) analog shift register. The plus and minus paths through the converter 10 also have a respective Digital to Analog (DAC) ladder 27-P, 27-M. Although not pertinent to the present invention, it should be noted that each charge ladder 27 has a number of internal reference charge generators and a number of adjustable charge splitters.

The DC sensor 20 is used for comparing the output charge from plus CCD pipeline 24-M to the output of minus CCD pipeline 24-P calibrates the circuit 10 in such a way that a low input offset is provided. The basic idea is to provide a circuit that determines a difference between the charges provided in the complimentary charge paths, by periodically swapping the connection between the inputs and the comparison circuits.

Figure 2:
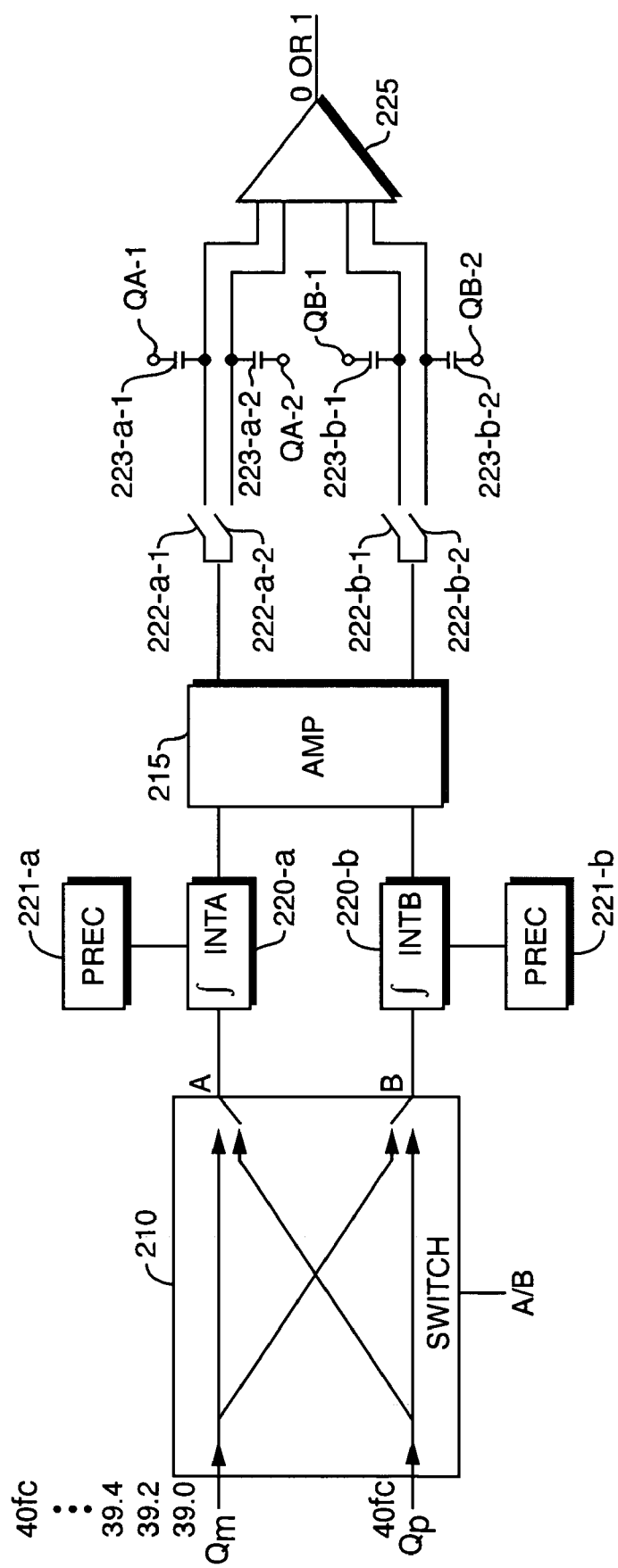
FIG. 2 is a more detailed block diagram of the DC sensor.

FIG. 2 shows one embodiment of DC sensor 20 in more detail. In this embodiment, DC sensor 20 consists of an input cross point (A/B) switch 210, integrators 220-A, 220-B, prechargers 221-A, 221-B, amplifier 215, sampling switches, 222-A-1, 222-A-2, 222-B-1, 222-B-2, sampling capacitors 223-A-1, 223-A-2, 223-B-1, 223-B-2 and output difference amplifier 225. Positive and negative charges, $Q_M$, $Q_P$, such as may be provided by the CCD pipelines 24-P, 24-M are first received at the switch 210. The charges may be input at a relatively high clock rate of, for example, 100 Megahertz (MHz) or higher.

The switch 210 allows for either the plus charge $Q_M$ or the minus charge $Q_P$ to be fed to the respective switch 210 output port A or B. Thus, in a first or "non-inverted" state, the switch 210 feeds $Q_M$ to output A and $Q_P$ to output B; in the other, or "inverted" state, switch 210 feeds charge $Q_P$ to output A and $Q_M$ to output B.

The A/B state or mode of the switch is changed at a rate which is somewhat slower than the input sample rate. In one embodiment, for example, the A/B toggle rate may be $1/48^{th}$ of the input charge sample rate.

The respective outputs of the switch 210 therefore are a series of charges that for a length of time correspond to the signal charges provided on input $Q_M$, followed by a series of the signal charges provided on input $Q_P$ for a subsequent length of time, then followed again by a series of the charges on input $Q_M$, then the $Q_P$ charges again, etc.

The switch outputs A and B can thus be thought of as having two states—a normal or "non-inverted" state when the switch 210 is in one position, and an inverted state when the switch is 210 is in the other position.

There is an integrator 220-A, 220-B associated with each of the A and B outputs. The integrators 220 are of the pre-chargeable type such that they are recharged to a preset voltage by the respective pre-charger 221 before each cycle of operation.

An amplifier 215 provides amplified versions of the integrator outputs for further processing. In particular, the integrator outputs are amplified and then fed to a set of four sampling switches 222-A-1, 222-A-2, 222-B-1, 222-B-2 and four sampling capacitors 223-A-1, 223-A-2, 223-B-1, and 223-B-2. There is a sampling switch 222 and corresponding capacitor 223 for storing each possible combination of switch state and input signal path—that is separate a sampling switch is provided for storing the integration result when (1) charge $Q_P$ is coupled to switch port A, (2) charge $Q_M$ is coupled to switch port B, (3) charge $Q_P$ is coupled to switch port B, and (4) charge $Q_M$ is coupled to switch port A.

The resulting pair of differential, sampled charges (carried on the four capacitor ouputs) are then compared using the differential difference amplifier 225. Since the input offset is amplified the same way for both the inverted and non-inverted input charge conditions (i.e., for both modes of the switch 210) any difference is effectively cancelled by the difference amplifier 225. Therefore, only the input charges themselves end up being compared, and any input offset is cancelled.

The output of the difference amplifier, which may be a digital bit, can then be fed back to control circuits such as a reference charge input, or calibration circuits.

Figure 3:
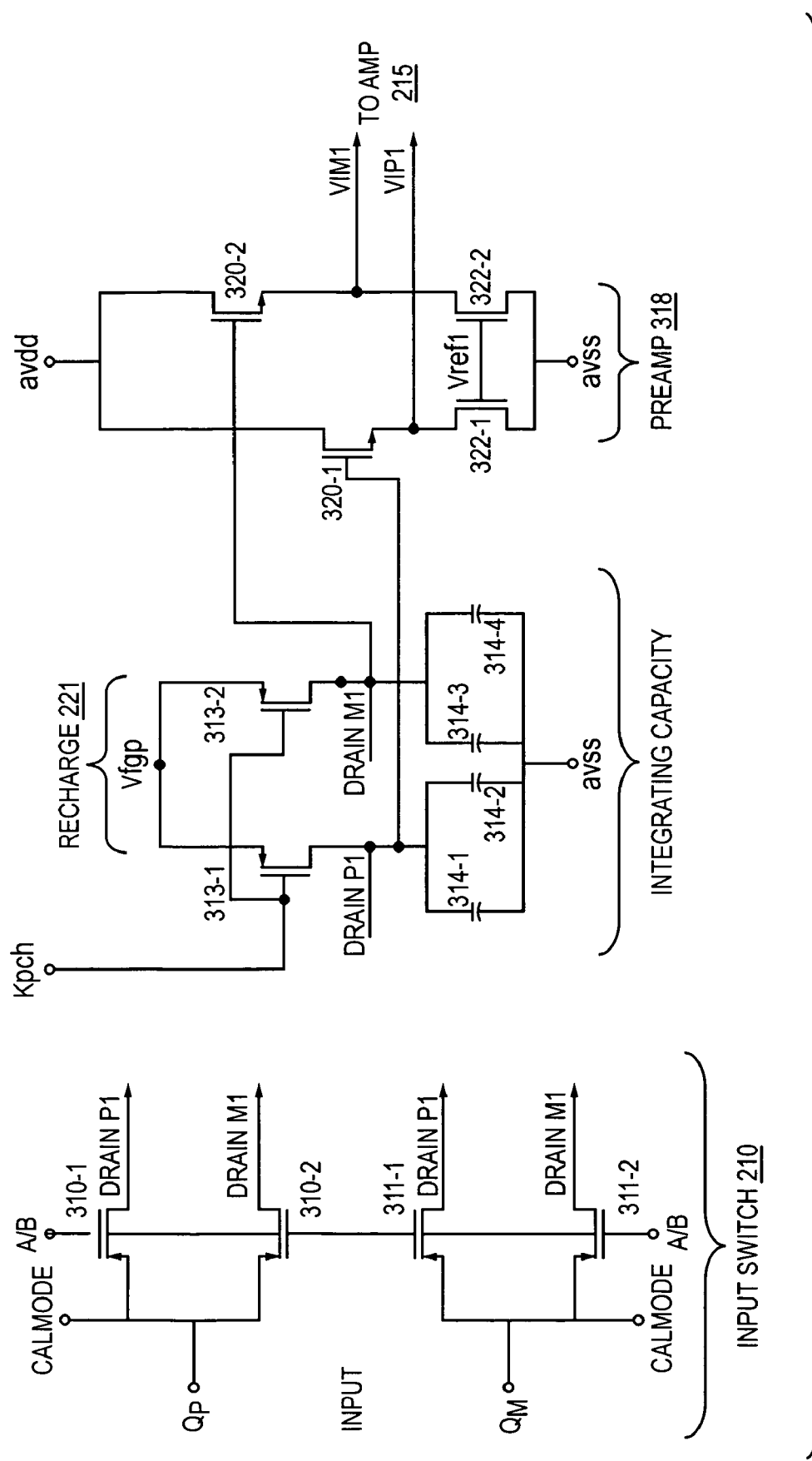
FIG. 3 is a detailed circuit diagram of portions of the DC sensor.

A more detailed circuit diagram of certain portion of the DC charge comparator 20 is shown in FIG. 3. The input switch 210, integrator pre-charge circuits 221, integrating capacitors 223, as well as a first stage of amplifier 220 are shown in much greater detail in this drawing. As shown the input chargers $Q_P$ and $Q_M$ are fed to a respective portions of the input switch 210. The input switch 210 consists of four transistors arranged in pairs. The first transistor pair 310-1 and 310-2 are coupled to receive the plus charge $Q_P$, and transistor pair 311-1 and 311-2 are arranged to receive the minus charge $Q_M$. In accordance with the state of the A/B input signal, the transistor pairs select their respective input charges to be passed along one of two outputs, either drain P1 or drain M1.

Thus, in a first mode where the A/B input is set to the A state, input charge $Q_P$ will be fed to the drain P1 output and the input charge $Q_M$ will be fed to the drain M1 output; when the input A/B is switched to the B mode, input charge $Q_P$ is steered to the drain M1 output and input charge $Q_M$ is steered to the drain P1 output.

A precharge circuit 221 is used to precharge the integrating capacitors. Specifically, precharge circuit 221 consists of a pair of transistors 313-1, 313-2 that respectively receive the drain P1 and drain M1 signals. The gates terminals of these transistors 313 are controlled by a clock input $K_{PCH}$ that determines the precharger state.

Integrating capacitors 314 are arranged to be fed to be coupled to the source terminals of respective transistors 313-1 and 313-2. Although four (4) capacitors are shown (with a pair of capacitors being necessary to provide the required capacitance for each path) other configurations for capacitors 314 are possible.

The integrated signals are then fed to an amplifier 215 in the preferred embodiment they are first fed, however, through a preamplifier 318. The preamplifier 318 consists of a pair of transistors 320-1, 320-2 for amplifying each of the respective signal paths. A reference voltage may be provided to control these preamplifiers 318 via reference stages 322-1, 322-2.

The result is to provide a pair of voltages $V_{IM1}$ and $V_{IP1}$ to the amplifier 215 that represent the plus and minus signal paths after they have been sampled and held and after they have been subjected to the operation of the input switch 210. In particular, signal $V_{IM1}$ will for a period of time have a value associated with it that depends on the value of the input charge $Q_P$, and for a period of time then correspond to the value of input charge $Q_M$. Likewise, $V_{IP1}$ will for a time have a value that depends upon input charge $Q_M$, and then take on a value for a period of time that depends on input charge $Q_P$.

Figure 4:
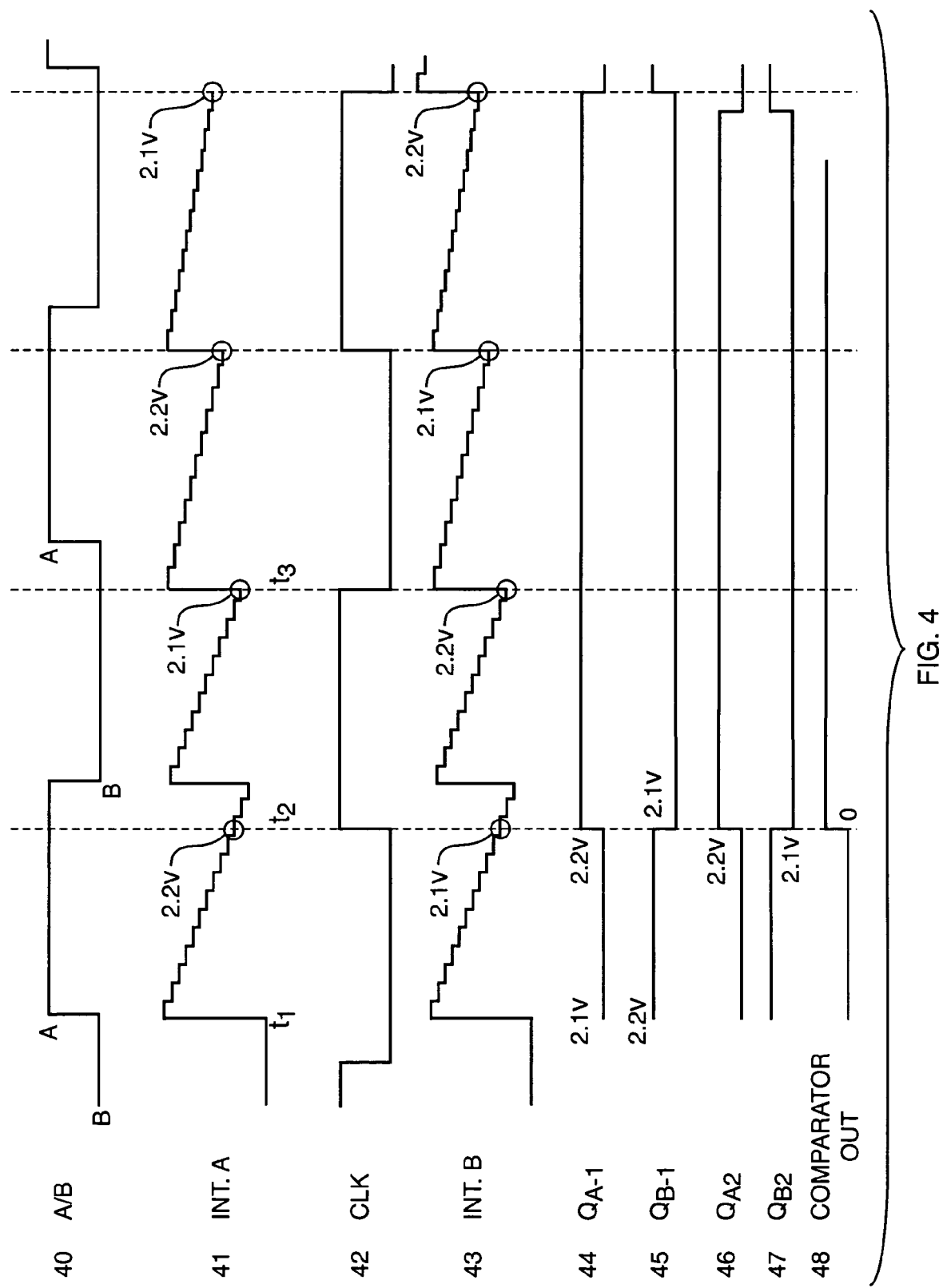
FIG. 4 is a timing diagram for the DC sensor.

FIG. 4 is a set of timing diagrams that further explain the operation of the DC charge comparator circuit 20.

The top signal trace 40 represents the A/B state of the mode switch 210.

Recall that a reference charge is fed to the input of the DC sensor 20. For the sake of the following discussion, let us assume an example situation where there is a slight difference in the amount of the reference charge fed to the two signal paths. In the example scenario shown in FIG. 4, an input reference charge of about 40 femto-coulombs (fc) is provided to the plus charge path $Q_P$, but an input reference charge of only 39 fc is provided to the minus $Q_M$ path.

The output of integrator A (220-A) is shown in signal trace 41. With the switch set in the A mode, after being pre-charged at time T1, the integrator output will slowly ramp down as each successive charge is fed through the pipeline. Eventually, a time T2 is reached that corresponds to the rising edge of a clock signal fed to the sampling switch 222. At this point, the remaining charge on the integrator 220-A is approximately 2.2 volts. This voltage will then be stored by the sampling capacitor 223-A-1 so that its output, $Q_{A-1}$, is also set to 2.2 volts, as shown in trace 44.

In a similar operation, the integrator 220-B for signal path B will be pre-charged at time T1 and gradually reach a particular voltage at time T2. This final voltage will be different for the B path, at 2.1 volts for example, due to the difference on charge $Q_M$. This voltage will be stored in the capacitor 223-B-1 as output $Q_{B-1}$ as shown in trace 45.

When the state of the A/B switch 210 changes again, the input charges fed to paths A and B are also swapped. Thus, the outputs of the integrators will also have been swapped at time T3, the output of integrator 220-A will be at 2.1 v, and the output of integrator 220-B will be at 2.2 v.

These voltages will then be stored on the corresponding capacitors 223 as output $Q_{A-2}$ shown in trace 46 and $Q_{B-2}$ shown in trace 47.

Therefore, due to the difference in input charge $Q_M$ and $Q_P$ of only about one (1) femto-coulomb, the comparator output signal 48 will stay at a logic 1 or high logic state. The signal can then be fed back to the microprocessor 30 to effect an adjustment to the reference charge generators 25-P, 25-M to increase the level of $Q_M$. When $Q_M$ is increased to a level larger than $Q_P$, the comparator output will switch to logic 0 or low state. In the illustrated example, it is suggested by FIG. 2 that adjustments will be made such that the charge $Q_M$ is gradually increased from 39 fc up to 40 fc, eventually reaching a point where the two input charges are equal.

Since the input offset is amplified through the same path for both the inverted, and non-inverted switch states, it is effectively cancelled by the difference amplifier and only differences in the input charges are compared.

Among the novel aspects believed to exist with the present invention is the use of a redirecting switch or "chopper" to feed a pair of integrators, to compare the integrator result at a first time with that as of a second time.

While this invention has been particularly shown and described with references to preferred embodiments thereof, it will be understood by those skilled in the art that various changes in form and details may be made therein without departing from the scope of the invention encompassed by the appended claims.

What is claimed is:

1. A charge comparator comprising:
a switch connected to receive a pair of charge inputs as a plus charge input and a minus charge input, with the switch having a first state wherein the plus signal charge is coupled to a first output and the minus signal charge is coupled to a second output, and a second state wherein the plus charge input is coupled to the second output and the minus charge input is coupled to the first output;
a pair of charge integrators, connected to the first and second switch outputs, to provide a first integrated output signal and a second integrated output signal;
a pair of sample and hold circuits, connected to sample and hold respective ones of the first and second integrated output signals; and
a difference amplifier, coupled to the pair of sample and hold circuits, to determine a difference between the outputs of the sample and hold circuits.

2. A charge comparator comprising:
a switch connected to receive a pair of charge inputs as a plus charge input and a minus charge input, with the switch having a first state wherein the plus signal charge is coupled to a first output and the minus signal charge is coupled to a second output, and a second state wherein the plus charge input is coupled to the second output and the minus charge input is coupled to the first output;
a pair of charge integrators, connected to the first and second switch outputs, to provide a first integrated output signal and a second integrated output signal;
a pair of sample and hold circuits, connected to sample and hold respective ones of the first and second integrated output signals;
a difference amplifier, coupled to the pair of sample and hold circuits, to determine a difference between the outputs of the sample and hold circuits; and
a signal amplifier, connected to the output of the integrators, to provide an amplified output thereof.

3. A charge comparator as in claim 2 additionally comprising:
a second pair of sample and hold circuits, connected to cooperate with the first pair of sample and hold circuits, such that in a first mode, the first pair of sample and hold circuits stores respective integrated charge samples from the plus charge input and minus charge input, and such that in a second mode, the second pair of sample and hold circuits stores the plus signal charge and the minus signal charge, respectively.

4. A charge comparator as in claim 3 wherein the difference amplifier is connected to determine the difference between the output of the first pair of sample and hold circuits in a first mode and is connected to determine a difference in the outputs between the second pair of sample and hold circuit outputs in a second mode.

5. A charge comparator as in claim 2 wherein the charge integrators integrate the respective input charges over multiple clock periods prior to operating the sample and hold circuit.

6. A charge comparator as in claim 2 additionally wherein the difference amplifier compares a charge integrator result at a first time with a charge integrator result a second time, such that a plus charge input applied with the switch in one state is compared with the plus charge input with the switch compared in another state.

7. A charge comparator as in claim 2 wherein the amplifier output in a non-inverted switch state is compared to an amplifier output in an inverted switch state, such that when fed to the differential difference amplifier any input offset is amplified in the same way for both the inverted and non-inverted switch conditions, to cancel an input offset.

8. A charge comparator as in claim 1 additionally comprising:
   a second pair of sample and hold circuits, connected to cooperate with the first pair of sample and hold circuits, such that in a first mode, the first pair of sample and hold circuits stores respective integrated charge samples from the plus charge input and minus charge input, and such that in a second mode, the second pair of sample and hold circuits stores the plus signal charge and the minus signal charge, respectively.

9. A charge comparator as in claim 8 wherein the difference amplifier is connected to determine the difference between the output of the first pair of sample and hold circuits in a first mode and is connected to determine a difference in the outputs between the second pair of sample and hold circuit outputs in a second mode.

10. A charge comparator as in claim 1 wherein the charge integrators integrate the respective input charges over multiple clock periods prior to operating the sample and hold circuit.

11. A charge comparator as in claim 1 additionally wherein the difference amplifier compares a charge integrator result at a first time with a charge integrator result a second time, such that a plus charge input applied with the switch in one state is compared with the plus charge input with the switch compared in another state.

12. A charge comparator as in claim 1 wherein the amplifier output in a non-inverted switch state is compared to an amplifier output in an inverted switch state, such that when fed to the differential difference amplifier any input offset is amplified in the same way for both the inverted and non-inverted switch conditions, to cancel an input offset.

* * * * *